United States Patent
Park et al.

(10) Patent No.: US 7,183,824 B2
(45) Date of Patent: Feb. 27, 2007

(54) DUTY CYCLE CORRECTION CIRCUIT AND A METHOD FOR DUTY CYCLE CORRECTION IN A DELAY LOCKED LOOP USING AN INVERSION LOCKING SCHEME

(75) Inventors: Kwang-Il Park, Yongin-si (KR); Hyun-Dong Kim, Seoul (KR); Mi-Jin Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 12 days.

(21) Appl. No.: 11/235,646

(22) Filed: Sep. 26, 2005

(65) Prior Publication Data

US 2006/0091921 A1    May 4, 2006

(30) Foreign Application Priority Data

Oct. 28, 2004    (KR) .................. 10-2004-0086558

(51) Int. Cl.
*H03K 3/017* (2006.01)
(52) U.S. Cl. .......................... 327/172; 327/175
(58) Field of Classification Search ........ 327/170–175, 327/178, 26, 291–296
See application file for complete search history.

(56) References Cited

U.S. PATENT DOCUMENTS 6,687,844 B1    2/2004  Zhang .................. 713/503
7,015,739 B2 *  3/2006  Lee et al. ................ 327/175

FOREIGN PATENT DOCUMENTS

| KR | 10-2000-0055361 | 9/2000 |
| KR | 10-2003-0052650 | 6/2003 |
| KR | 10-2003-0090122 | 11/2003 |
| KR | 10-2004-0066281 | 7/2004 |

* cited by examiner

*Primary Examiner*—Linh My Nguyen
(74) *Attorney, Agent, or Firm*—F. Chau & Associates, LLC

(57) ABSTRACT

Provided are a duty cycle correction circuit and method for duty cycle correction in a delay locked loop using an inversion locking scheme. The duty cycle correction circuit comprises: a correction unit exchanging and receiving a first duty correction signal and a second duty correction signal and selecting and receiving one of an input clock signal and an inversion signal of the input clock signal in response to an inversion locking signal, and correcting the duty cycle of the received input clock signal or inversion signal of the input clock signal in response to the first and second duty correction signals; a buffer buffering an output signal of the correction unit and outputting the buffered signal as a corrected clock signal; and a duty detector selecting and receiving one of the corrected clock signal and an inversion signal of the corrected clock signal in response to the inversion locking signal, and generating the first and second duty correction signals using the received corrected clock signal or inversion signal of the corrected clock signal.

18 Claims, 7 Drawing Sheets

DUTY CYCLE CORRECTION CIRCUIT AND A METHOD FOR DUTY CYCLE CORRECTION IN A DELAY LOCKED LOOP USING AN INVERSION LOCKING SCHEME

CROSS-REFERENCE TO RELATED PATENT APPLICATION

This application claims priority to Korean Patent Application No. 10-2004-0086558, filed on Oct. 28, 2004 in the Korean Intellectual Property Office, the disclosure of which is incorporated by reference herein in its entirety.

BACKGROUND OF THE INVENTION

1. Technical Field

The present invention relates to a delay locked loop (DLL), and more particularly, to a duty cycle correction circuit and a method for duty cycle correction in a DLL.

2. Discussion of the Related Art

In general, in most electronic systems, such as a semiconductor memory device, a video/audio signal processing system or a communications system, a clock is needed for timing control or synchronization. Typically, a delay locked loop (DLL) is used to produce a precise clock signal.

FIG. 1 is a block diagram of a conventional DLL 100. The DLL 100 includes a phase detector 110, a charge pump 120, a loop filter 130, a duty cycle correction circuit 140, a delayer 150, and a buffer 160. The DLL 100 corrects the duty cycle of an input clock signal CLK using an inversion locking scheme or produces an output clock signal DCLK by delaying the input clock signal CLK for a predetermined time. The duty cycle correction circuit 140 corrects the duty cycle of the input clock signal CLK and outputs a corrected clock signal CLKO, controlled by an inversion locking signal IVS. The delayer 150 receives and delays the corrected clock signal CLKO for a predetermined time and outputs the delay result to the buffer 160. Then, the buffer 160 buffers the delay result and outputs the output clock signal DCLK. The phase detector 110 detects the difference in phase between a signal FED output from the delayer 150 and the input clock signal CLK. The charge pump 120 produces a current corresponding to the difference in phase. The loop filter 130 produces a delay control signal VCTL that is proportional to the current generated by the charge pump 120. The length of time that the corrected clock signal CLKO input to the delayer 150 is delayed is determined by the delay control signal VCTL.

Thus, the DLL 100 generates the output clock signal DCLK by using the duty cycle correction circuit 140 according to the inversion locking scheme.

FIG. 2 is a detailed block diagram of the duty cycle correction circuit 140 of FIG. 1. Referring to FIG. 2, the duty cycle correction circuit 140 includes a clock selector 141, an amplifier 142, a buffer 143, and a duty detector 144. The clock selector 141 generates an inversion signal of the input clock signal CLK using an inverter 211, and selectively outputs one of the input clock signal CLK and the inversion signal using a multiplexer 212, controlled by the inversion locking signal IVS. The use of the inversion locking scheme that selectively outputs one of the input clock signal CLK and the inversion signal enables the manufacture of the delayer 150 of FIG. 1 with a smaller number of delay cells. When the corrected clock signal CLKO is fed back to the duty detector 144, the duty detector 144 detects duty correction signals DCC and DCCB and outputs them to the amplifier 142. Then, the amplifier 142 amplifies the input clock signal CLK or the inversion signal selected by the clock selector 141, in response to the duty correction signals DCC and DCCB. The amplified input clock signal CLK is buffered by and output as the corrected clock signal CLKO from the buffer 143. In other words, the corrected clock signal CLKO output from the duty cycle correction circuit 140 is obtained by correcting the duty cycle of the input clock signal CLK. The duty factor represents a percentage (%) ratio of the period of a clock signal at a logic high level to the pulse duration of the clock signal. The duty cycle correction circuit 140 corrects the duty cycle of the input clock signal CLK to 50% and outputs the corrected clock signal CLKO.

However, only the clock selector 141 of the duty cycle correction circuit 140 is controlled by the inversion locking signal IVS. The amplifier 142 and the duty detector 144 operate without regard to the inversion locking scheme. Thus, when the duty factor of the input clock signal CLK is 55%, the duty factor of the clock signal CLK input to the amplifier 142 is between 45% and 55% according to the logic state of the inversion locking signal IVS. For example, the duty factor of the clock signal CLK input to the amplifier 142 is 55% when the clock selector 141 selects the clock signal CLK, and the duty factor of the clock signal CLK is 45% when the clock selector 141 selects the inversion signal of the clock signal CLK. When the logic state of the inversion locking signal IVS changes after the amplifier 142 and the duty detector 144 are stabilized, the amplifier 142 and the duty detector 144, which operate in response to the inversion signal, must operate again to correct the duty cycle of a newly input clock signal. Accordingly, an overall locking time in the DLL 100 is increased, thereby causing a jitter to occur in the DLL 100 and thus causing the DLL 100 to malfunction.

SUMMARY OF THE INVENTION

According to an aspect of the present invention, there is provided a duty cycle correction circuit comprising a correction unit exchanging and receiving a first duty correction signal and a second duty correction signal and selecting and receiving one of an input clock signal and an inversion signal of the input clock signal in response to an inversion locking signal, and correcting the duty cycle of the received input clock signal or inversion signal of the input clock signal in response to the first and second duty correction signals; a buffer buffering an output signal of the correction unit and outputting the buffered signal as a corrected output signal; and a duty detector selecting and receiving one of the corrected clock signal and an inversion signal of the corrected clock signal in response to the inversion locking signal, and generating the duty correction signals using the received corrected clock signal or inversion signal of the corrected clock signal.

The correction unit includes a selector selecting one of the input clock signal and the inversion signal of the input clock signal according to the logic state of the inversion locking signal; an exchanger exchanging the first and second duty correction signals with each other according to the logic state of the inversion locking signal; and an amplifier correcting the duty cycle of the clock signal selected by the selector, in response to the first and second duty correction signals output from the exchanger. The amplifier is a differential amplifier which receives the input clock signal and the inversion signal of the input clock signal as a first pair of input signals, and receives the first and second duty correction signals as a second pair of input signals in parallel with the first pair of signals.

The amplifier includes a clock signal input unit receiving the first pair of input signals via first and second transistors; and a correction signal input unit receiving the second pair of input signals via third and fourth transistors.

The correction unit uses a differential amplifier which selects and receives the input clock signal and the inversion signal of the input clock signal, or inversion signals of the input clock signal and the inversion signal of the input clock signal according to the logic state of the inversion locking signal. The differential amplifier includes a clock signal input unit receiving the input clock signal and the inversion signal of the input clock signal selected by a selector, wherein the clock signal input unit is connected to a selector selecting one of the input clock signal and the inversion signal of the input clock signal according to the logic state of the inversion locking signal.

The correction unit also uses a differential amplifier which selects and receives the first and second duty correction signals, or the exchanged second and first duty correction signals according to the logic state of the inversion locking signal in parallel with the receipt of the clock signals. The differential amplifier includes a correction signal input unit receiving the first and second duty correction signals in parallel with the input clock signal and the inversion signal of the input clock signal, wherein the correction signal input unit is connected to an exchanger exchanging the first and second duty correction signals with each other according to the logic state of the inversion locking signal.

The duty detector comprises a selector selecting one of the corrected clock signal and the inversion signal of the corrected clock signal according to the logic state of the inversion locking signal; and a correction signal generator generating the duty correction signals using the clock signal selected by the selector. The correction signal generator uses a differential amplifier which receives the corrected clock signal and the inversion signal of the corrected clock signal as a pair of input signals. The differential amplifier includes an output clock signal input unit receiving the corrected clock signal and the inversion of the corrected clock signal as the pair of input signals.

The duty detector includes a selector selecting one of the clock signals according to the logic state of the inversion locking signal, wherein the selector is connected to an output clock signal input unit receiving the selected clock signal. The duty detector selects and receives the corrected clock signal and the inversion of the clock signal according to the logic state of the inversion locking signal.

According to another aspect of the present invention, there is provided a duty cycle correction method comprising exchanging and receiving a first duty correction signal and a second duty correction signal according to an inversion locking signal; selecting and receiving one of an input clock signal and an inversion signal of the input clock signal; correcting the duty cycle of the received input clock signal or the inversion signal of the input clock signal in response to the first and second duty correction signals; buffering the received input clock signal or the inversion signal of the input clock signal whose duty cycle is corrected, and outputting the buffered signal as a corrected clock signal; selecting and receiving one of the corrected clock signal and the inversion signal of the corrected clock signal according to the inversion locking signal; and generating the first and second duty correction signals, using the received corrected clock signal or the inversion signal of the corrected clock signal.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS

Figure 1:
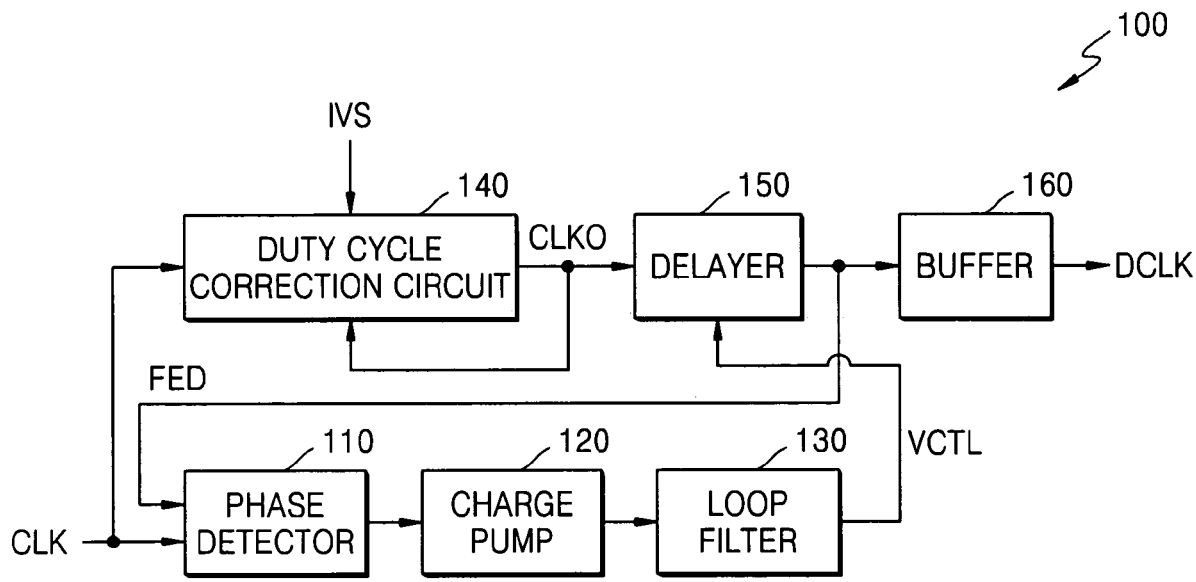
FIG. 1 is a block diagram of a conventional delay locked loop (DLL)

Hereinafter, exemplary embodiments of the present invention will be described in detail with reference to the accompanying drawings. Like reference numerals are used to designate like or equivalent elements throughout this disclosure.

Figure 3:
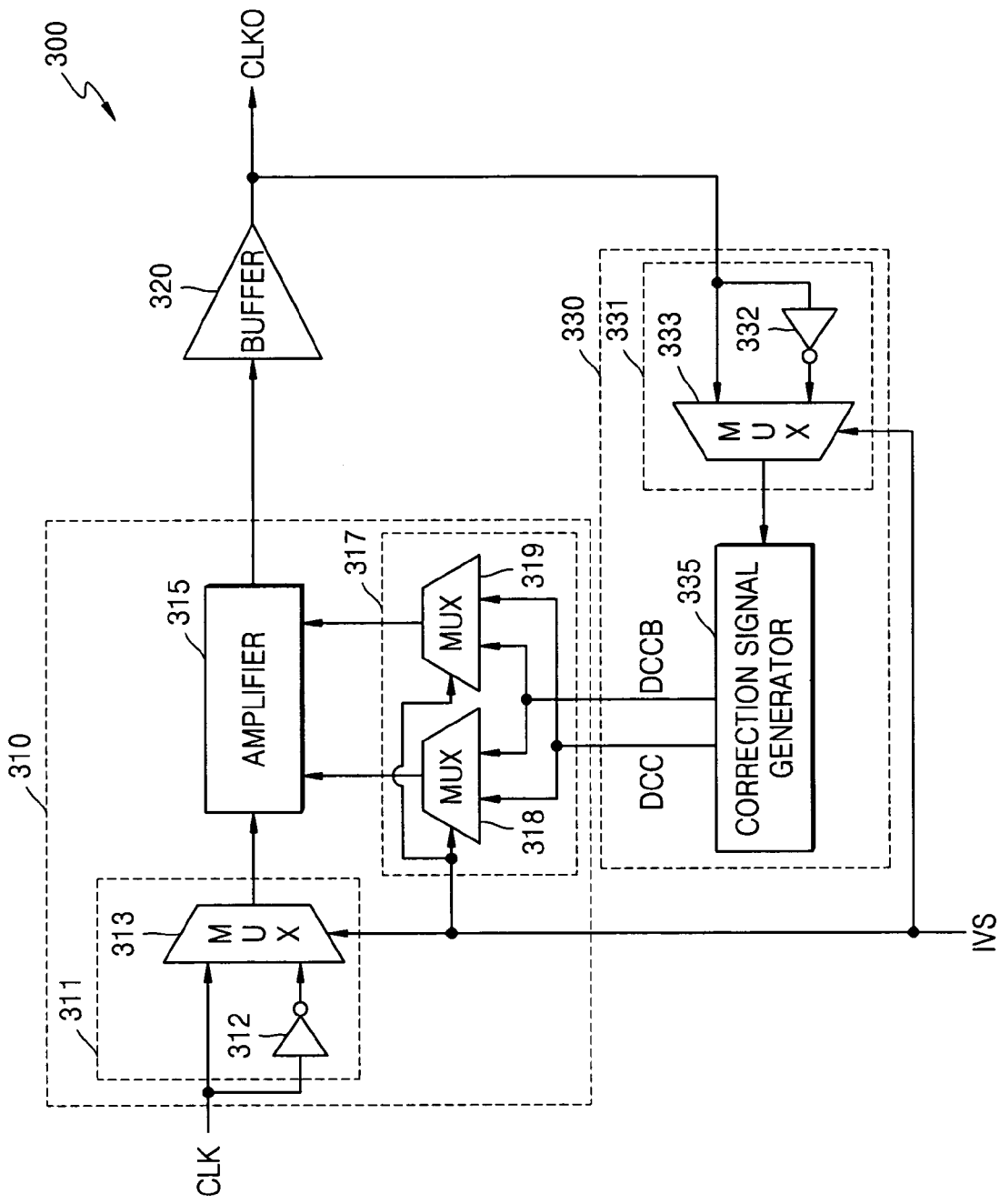
FIG. 3 is a block diagram of a duty cycle correction circuit according to an exemplary embodiment of the present invention.

FIG. 3 is a block diagram of a duty cycle correction circuit 300 according to an embodiment of the present invention. The duty cycle correction circuit 300 includes a correction unit 310, a buffer 320, and a duty detector 330.

Figure 4:
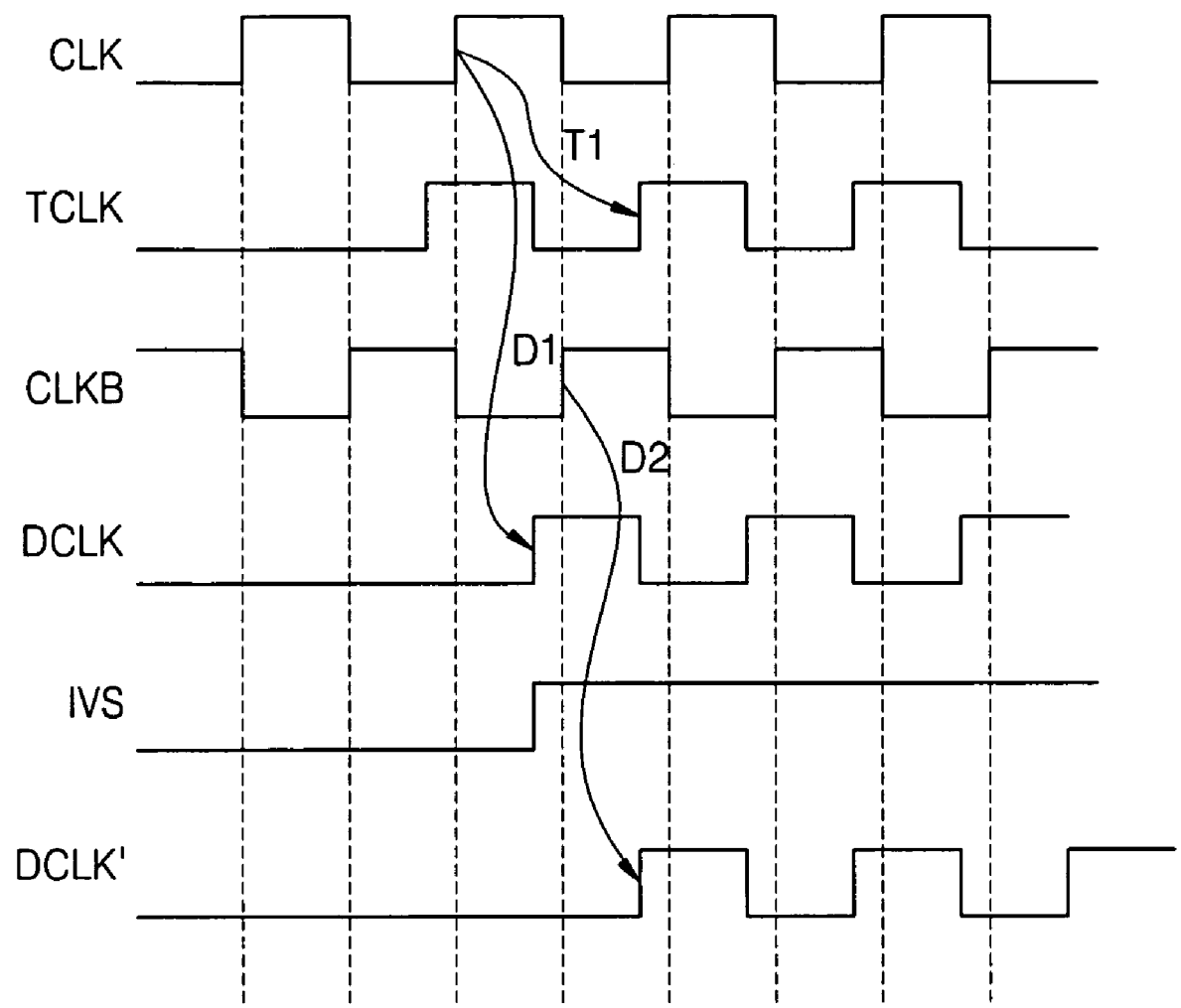
FIG. 4 is a timing diagram illustrating an inversion locking scheme according to an exemplary embodiment of the present invention.

The correction unit 310 and the duty detector 330 of the duty cycle correction circuit 300 are controlled by an inversion locking signal IVS. As described above, the use of an inversion locking scheme enables the manufacture of the delayer 150 of FIG. 1 with a smaller number of delay cells. In an inversion locking scheme according to the present invention, a desired clock signal TCLK, which is delayed by a time T1 from an input clock signal CLK of the DLL 100 of FIG. 1, is obtained by processing an inversion signal CLKB of the input clock signal CLK by using the duty cycle correction circuit 300 in response to the inversion locking signal IVS. In other words, referring to FIG. 4, when the duty cycle correction circuit 300 does not use the inversion locking scheme, an output clock signal DCLK can be obtained by delaying the input clock signal CLK for a time D1. Next, an output clock signal DCLK', which is delayed a time D2, is obtained by processing the inversion signal CLKB by using the duty cycle correction circuit 300 in response to the inversion locking signal IVS. Here, the time D1 is almost equal to that of the time D2. Thus, the output clock signal DCLK' can be produced in phase with the desired clock signal TCLK according to the inversion locking scheme without increasing the number of delay cells in a delayer.

In the duty cycle correction circuit 300 using the inversion locking scheme, the inversion locking signal IVS is input to both the correction unit 310 and the duty detector 330, thereby preventing a locking time from increasing when the correction unit 310 operates to correct the duty cycle of the input clock signal CLK when the logic state of the inversion locking signal IVS changes.

To prevent an increase in the locking time, the correction unit 310 selects and receives one of the input clock signal CLK and the inversion signal CLKB in response to the inversion locking signal IVS. Also, the correction unit 310 exchanges and receives a first duty correction signal DCC and a second duty correction signal DCCB in response to the inversion locking signal IVS, and corrects the duty cycle of the selected clock signal CLK or CLKB using the first and second duty correction signals DCC and DCCB. The operation of the correction unit 310 will be described later in greater detail.

The buffer 320 buffers a signal output from the correction unit 310 and outputs the buffered signal as a corrected clock signal CLKO.

The duty detector 330 selects and receives one of the corrected clock signal CLKO and an inversion signal CLKOB of the corrected clock signal CLKO in response to the inversion locking signal IVS, and produces the first and second duty correction signals DCC and DCCB using the selected corrected clock signal CLKO or inversion signal CLKOB. The operation of the duty detector 330 will also be described later in greater detail.

Referring again to FIG. 3, the correction unit 310 includes a selector 311, an exchanger 317, and an amplifier 315. An inverter 312 of the selector 311 produces the inversion signal CLKB. A multiplexer 313 of the selector 311 selects and outputs one of the input clock signal CLK and the inversion signal CLKB according to the logic state of the inversion locking signal IVS.

For example, a first multiplexer 318 of the exchanger 317 selects and outputs the first duty correction signal DCC when the inversion locking signal IVS is at a logic low level, and selects and outputs the second duty correction signal DCCB when the inversion locking signal IVS is at a logic high level. In contrast, a second multiplexer 319 of the exchanger 317 selects and outputs the second duty correction signal DCCB when the inversion locking signal IVS is at the logic low level, and selects and outputs the first duty correction signal DCC when the inversion locking signal IVS is at the logic high level. In other words, the exchanger 317 exchanges and outputs the first and second duty correction signals. DCC and DCCB according to the logic state of the inversion locking signal IVS.

The amplifier 315 corrects the duty cycle of the input clock signal CLK or the inversion signal CLKB selected by the selector 311, in response to the duty correction signals DCC and DCCB output from the exchanger 317.

Figure 5:
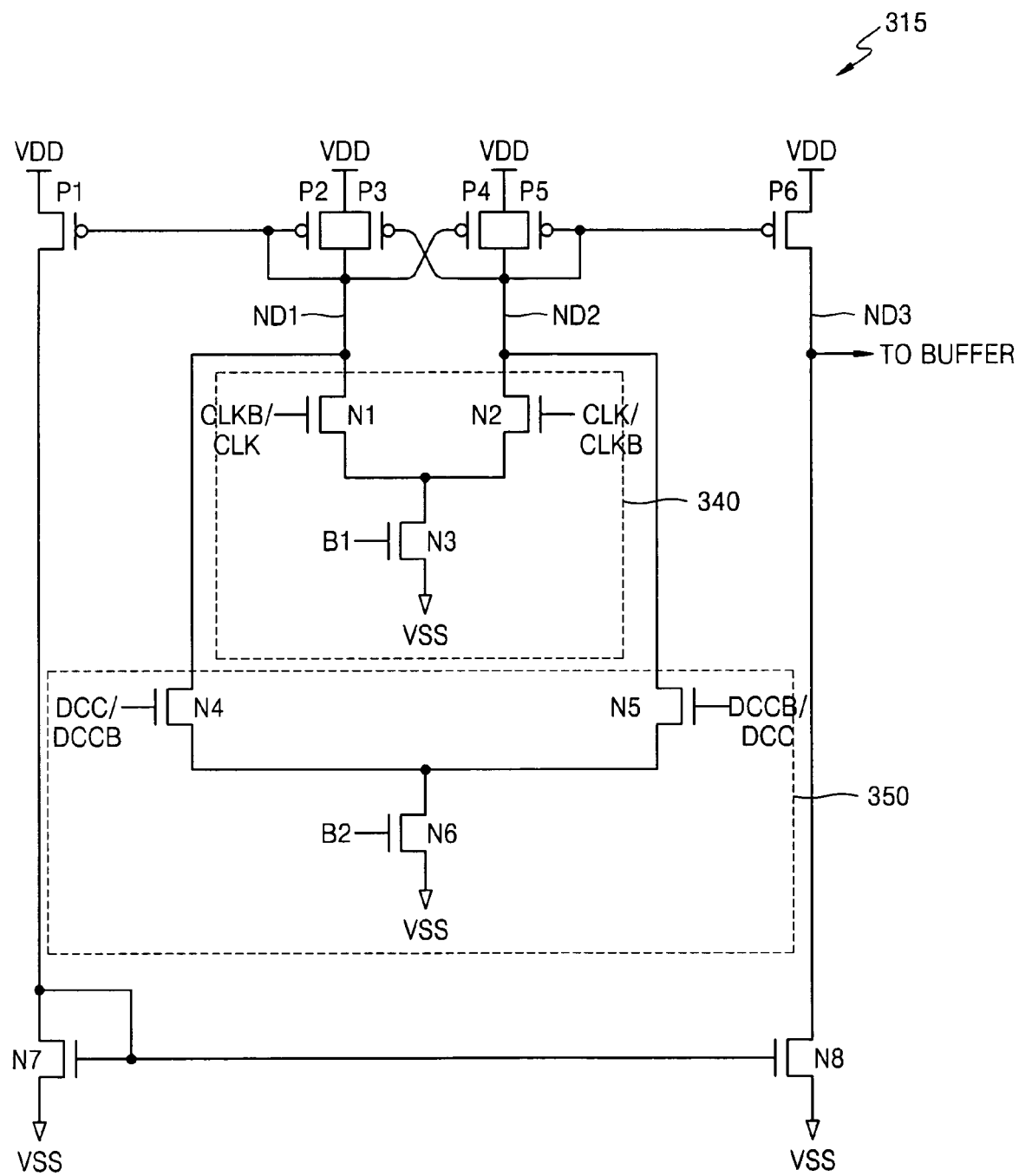
FIG. 5 is a circuit diagram of an amplifier of FIG. 3.

FIG. 5 illustrates a detailed circuit diagram of the amplifier 315 of FIG. 3. Referring to FIG. 5, the amplifier 315 includes a clock signal input unit 340 consisting of Metal-Oxide-Semiconductor Field Effect Transistors (MOSFETs) N1 through N3; a correction signal input unit 350 consisting of MOSFETs N4 through N6; and MOSFETs P1 through P6, N7, and N8 connected to the clock signal input unit 340 and the correction signal input unit 350. The amplifier 315 is a differential amplifier that uses bias voltages B1 and B2 and operates between a first power supply VDD and a second power supply VSS.

The clock signal input unit 340 receives the input clock signal CLK and the inversion signal CLKB as a first pair of input signals via the MOSFETs N1 and N2. It is assumed that one of the input clock signal CLK and the inversion signal CLKB is output from the selector 311, but an inversion signal of the input signal CLK or the inversion signal CLKB selected by the selector 311 is obtained by an inverter of the amplifier 315. Thus, the selector 311 outputs one of the input clock signal CLK and the inversion signal CLKB, but the clock signal input unit 340 always receives the input clock signal CLK and the inversion signal CLKB as the first pair of input signals. For example, when the inversion locking signal IVS is at a logic low level, the clock signal input unit 340 receives the input clock signal CLK via the MOSFET N2 and the inversion signal CLKB via the MOSFET N1. When the inversion locking signal IVS is at a logic high level, the clock signal input unit 340 receives the input clock signal CLK via the MOSFET N1 and the inversion signal CLKB via the MOSFET N2.

The correction signal input unit 350 is connected to the clock signal input unit 340 in parallel, such that nodes ND1 and ND2 are shared by the correction signal input unit 350 and the clock signal input unit 340. Therefore, the correction signal input unit 350 can receive the first and second duty correction signals DCC and DCCB as a second pair of input signals in parallel with the first pair of clock signals CLK and CLKB. The first and second duty correction signals DCC and DCCB output from the exchanger 317 are exchanged with each other according to the logic state of the inversion locking signal IVS. Thus, whether the first and second duty correction signals DCC and DCCB, or the second and first duty correction signals DCCB and DCC are input to the MOSFETs N4 and N5, respectively, is determined according to the logic state of the inversion locking signal IVS. Specifically, when the inversion locking signal IVS is at a logic low level, the correction signal input unit 350 receives the first duty correction signal DCC via the MOSFET N4, and the second duty correction signal DCCB via the MOSFET N5. When the inversion locking signal IVS is at a logic high level, the correction signal input unit 350 receives the second duty correction signal DCCB via the MOSFET N4 and the first duty correction signal DCC via the MOSFET N5.

Figure 6:
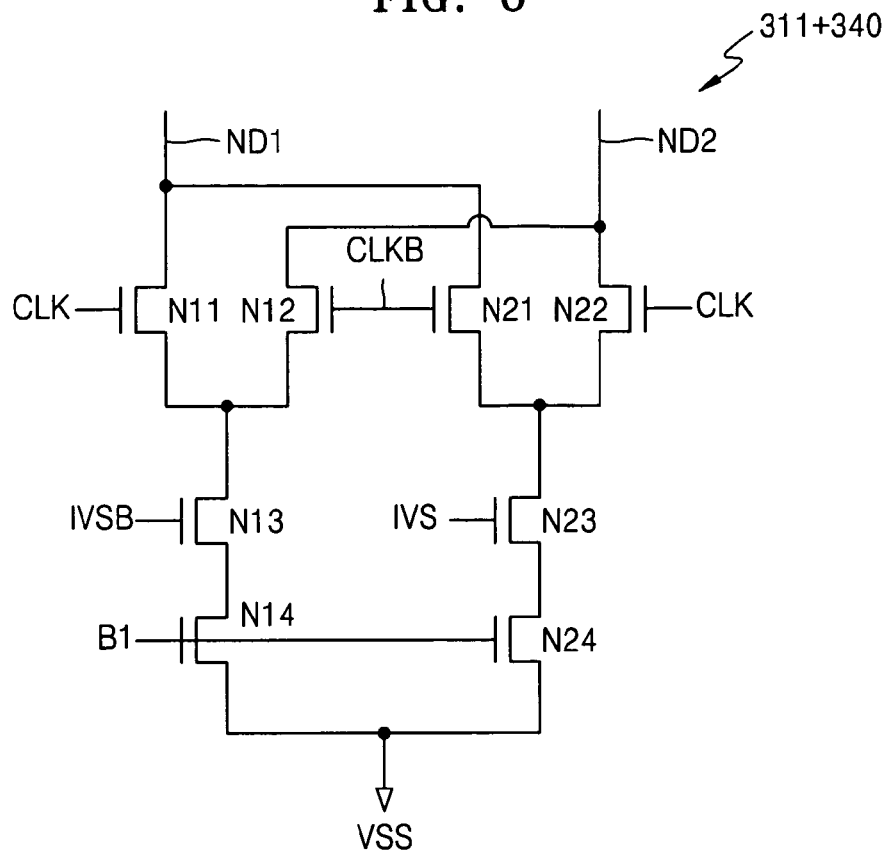
FIG. 6 is a circuit diagram of a combination of a clock signal input unit of FIG. 5 and a selector of FIG. 3.

The clock signal input unit 340 of FIG. 5 may be combined with the selector 311. FIG. 6 is a circuit diagram of a combination of the clock signal input unit 340 of FIG. 5 and the selector 311. The circuit of FIG. 6 can perform the operation of the selector 311 that selects one of two clock signals according to the logic state of an inversion locking signal IVS, and the operation of the clock signal input unit 340 that receives a clock signal selected by the selector 311. More specifically, when the inversion locking signal IVS is at a logic low level, current flowing through nodes ND1 and ND2 is controlled by MOSFETs N11 through N14. In this case, when an input clock signal CLK input to the MOSFET N1 is at a logic high level, a lot of current flows through the node ND1 as compared to the amount of current flowing through the node ND1 when the input clock signal CLK is at a logic low level, and when an inversion signal CLKB of the input clock signal CLK, which is input to the MOSFET N12, is at a logic high level, a lot of current flows through the node ND2 as compared to the amount of current flowing through the node ND2 when the inversion signal CLKB is at a logic low level. In contrast, when the inversion locking signal IVS is at a logic high level, current flowing through the nodes ND1 and ND2 is controlled by MOSFETs N21 through N24. In this case, when an input clock signal CLK input to the MOSFET N22 is at a logic high level, a lot of current flows through the node ND2 as compared to the amount of current flowing through the node ND2 when the input clock signal CLK is at a logic low level, and when an inversion signal CLKB of the input clock signal CLK, which is input to the MOSFET N21, is at a logic high level, a lot of current flows through the node ND1 as compared to the amount of current flowing through the node ND1 when the inversion signal CLKB is at a logic low level. If the circuit of FIG. 6 is connected to the amplifier 315, the amplifier 315 selects and receives the input clock signal CLK and the inversion signal CLKB, or inversion signals of the input clock signal CLK and the inversion signal CLKB according to the logic state of the inversion locking signal IVS, and performs the operation of a differential amplifier.

Figure 7:
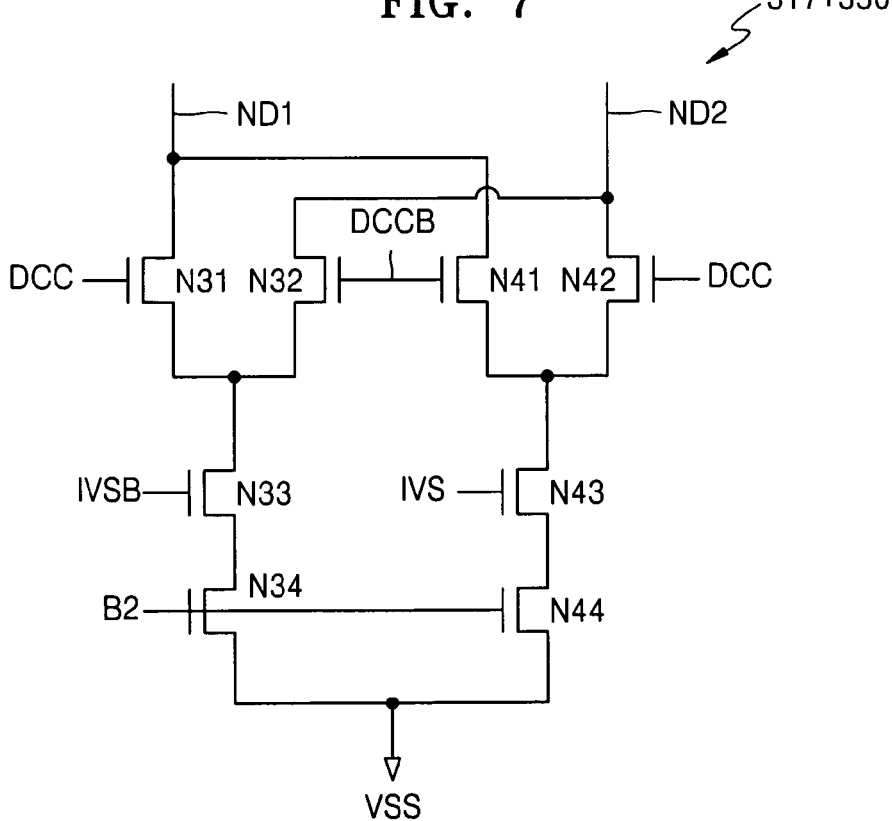
FIG. 7 is a circuit diagram of a combination of a corrected clock signal input unit of FIG. 5 and an exchanger of FIG. 3.

The correction signal input unit 350 of FIG. 5 may also be combined with the exchanger 317 of FIG. 3. FIG. 7 is a circuit diagram of a combination of the correction signal input unit 350 and the exchanger 317. The circuit of FIG. 7 can perform the operation of the exchanger 317 that exchanges the duty correction signals DCC and DCCB according to the logic state of the inversion locking signal IVS, and the operation of the correction signal input unit 350 that receives the exchanged correction signals DCC and DCCB. The circuit of FIG. 7 may be connected to the circuit of FIG. 6 in parallel, such that it can share the nodes ND1 and ND2 with the circuit of FIG. 6. In the circuit of FIG. 7, when the inversion locking signal IVS is at a logic low level, current flowing through the nodes ND1 and ND2 is controlled by MOSFETs N31 through N34. In this case, when the first duty correction signal DCC input to the MOSFET N31 is at a logic high level, a lot of current flows through the node ND1 as compared to the amount of current flowing through the node ND1 when the first duty correction signal DCC is at a logic low level, and when the second duty correction signal DCCB input to the MOSFET N32 is at a logic high level, a lot of current flows through the node ND2 as compared to the amount of current flowing through the node ND2 when the second duty correction signal DCCB is at a logic low level. On the other hand, when the inversion locking signal IVS is at a logic high level, the current flowing through the nodes is controlled by MOSFETs N41 through N44. In this case, when the second duty correction signal DCCB input to the MOSFET N41 is at a logic high level, a lot of current flows through the node ND1 as compared to the amount of current flowing through the node ND1 when the second duty correction signal DCCB is at a logic low level, and when the first duty correction signal DCC input to the MOSFET N42 is at a logic high level, a lot of current flows through the node ND2 as compared to the amount of current flowing through the node ND2 when the first duty correction signal DCC is at a logic low level. Thus, when the circuit of FIG. 7 is connected to the amplifier 315, the amplifier 315 can select and receive the first and second duty correction signals DCC and DCCB, or the exchanged second and first duty correction signals DCCB and DCC according to the logic state of the inversion locking signal IVS, and perform the operation of a differential amplifier.

Referring again to FIG. 3, the duty detector 330 includes a selector 331 and a correction signal generator 335. The selector 331 produces an inversion signal CLKOB of the corrected clock signal CLKO using an inverter 332, and selects and outputs one of the corrected clock signal CLKO and the inversion signal CLKOB using a multiplexer 333 according to the logic state of the inversion locking signal IVS.

The correction signal generator 335 produces the duty correction signals DCC and DCCB using the corrected clock signal CLKO or the inversion signal CLKOB selected by the selector 331.

Figure 8:
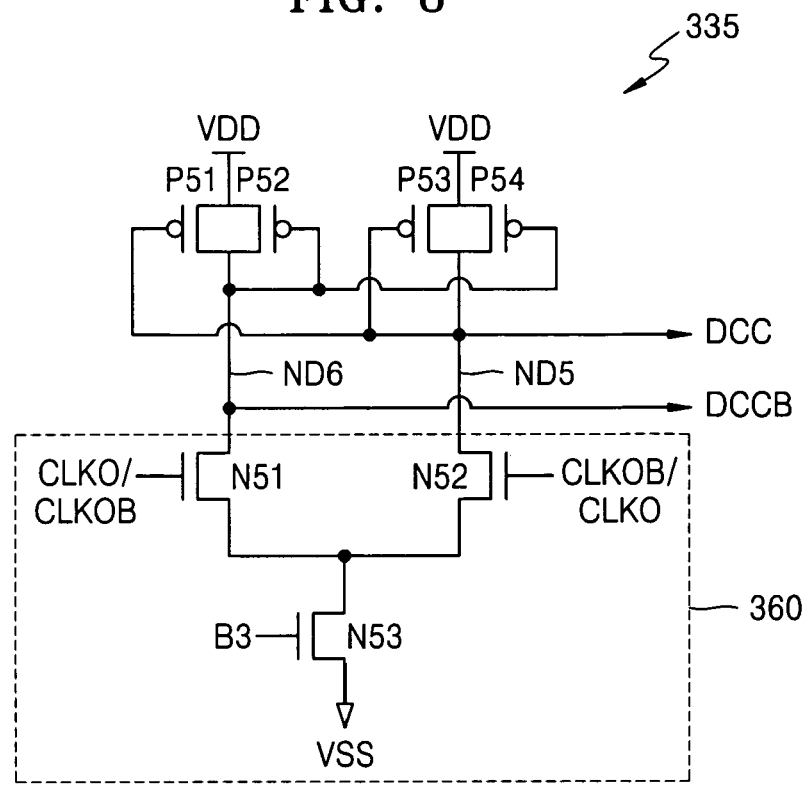
FIG. 8 is a circuit diagram of a correction signal generator of FIG. 3.

FIG. 8 is a circuit diagram of the correction signal generator 335 of FIG. 3. Referring to FIG. 8, the correction signal generator 335 includes an output clock signal input unit 360 consisting of MOSFETs N51 through N53, and MOSFETs P51 through P54 connected to the output clock signal input unit 360. The correction signal generator 335 is a differential amplifier that uses a bias voltage B3 and operates between a first power supply VDD and a second power supply VSS. The correction signal generator 335 produces the first and second duty correction signals DCC and DCCB, respectively.

The output clock signal input unit 360 receives the corrected clock signal CLKO and the inversion signal CLKOB as a pair of input signals via the MOSFESTs N51 and N52. It is assumed that only one of the corrected clock signal CLKO and the inversion signal CLKOB is output from the selector 331, but an inversion signal of the corrected clock signal CLKO and the inversion signal CLKOB is obtained by an inverter of the output clock signal input unit 360. In this case, although the selector 331 outputs only one of the corrected clock signal CLKO and the inversion signal CLKOB to the output clock signal input unit 360, the output clock signal input unit 360 can receive both the corrected clock signal CLKO and the inversion signal CLKOB as the pair of input signals. Specifically, when the inversion locking signal IVS is at a logic low level, the output clock signal input unit 360 receives the corrected clock signal CLKO via the MOSFET N51 and the inversion signal CLKOB via the MOSFET N52. However, when the inversion locking signal IVS is at a logic high level, the output clock signal input unit 360 receives the corrected clock signal CLKO via the MOSFET N52 and the inversion signal CLKOB via the MOSFET N51.

Figure 9:
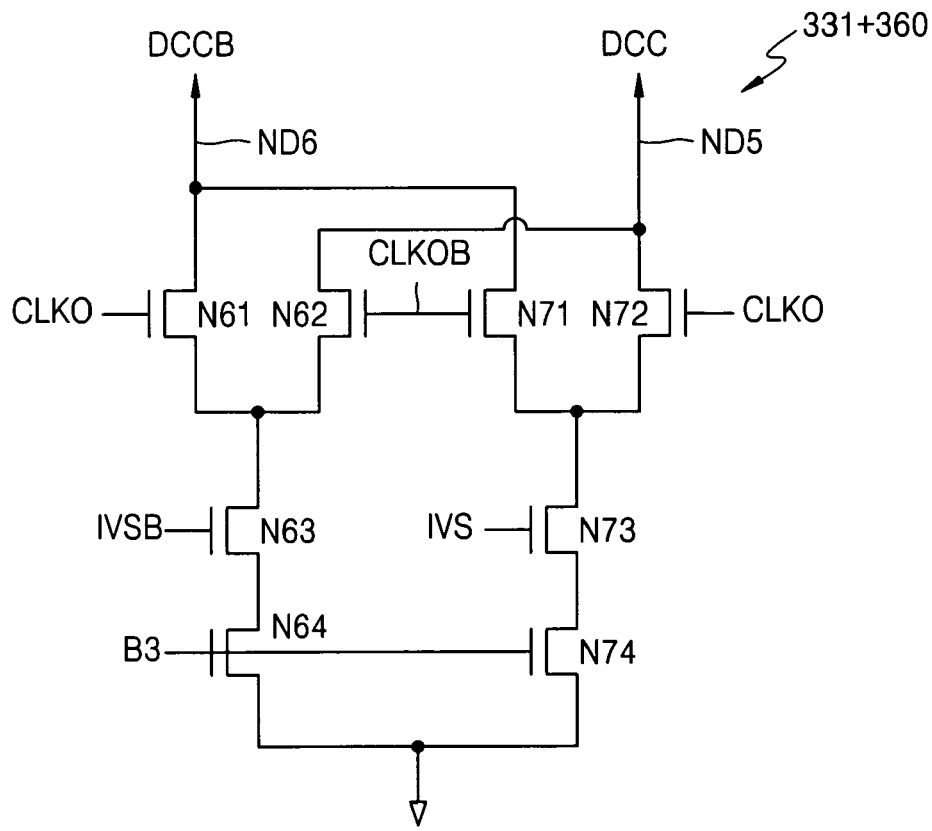
FIG. 9 is a circuit diagram of a combination of an output clock signal input unit of FIG. 8 and the selector of FIG. 3.

The output clock signal input unit 360 of FIG. 8 may be combined with the selector 331 of FIG. 3. FIG. 9 is a circuit diagram of a combination of the output clock signal input unit 360 and the selector 331. The circuit of FIG. 9 can perform the operation of the selector 331 that selects one of the clock signals according to the logic state of the inversion locking signal IVS, and the operation of the output clock signal input unit 360 that receives the selected clock signal. In the circuit of FIG. 9, when the inversion locking signal IVS is at a logic low level, current flowing through the nodes ND5 and ND6 is controlled by MOSFETs N61 through N64. When the corrected clock signal CLKO input to the MOSFET N61 is at a logic high level, a lot of current flows through the node ND5 as compared to the amount of current flowing through the node ND5 when the corrected clock signal CLKO is at a logic low level, and when the inversion signal CLKOB input to the MOSFET N62 is at a logic high level, a lot of current flows through the node ND6 as compared to the amount of current flowing through the node ND6 when the inversion signal CLKOB is at a logic low level. In contrast, when the inversion locking signal IVS is at a logic high level, the current flowing through the nodes ND5 and ND6 is controlled by the MOSFETs N71 through N74. In this case, when the corrected clock signal CLKO input to the MOSFET N72 is at a logic high level, a lot of current flows through the node ND5 as compared to the amount of current flowing through the node ND5 when the corrected clock signal CLKO is at a logic low level, and when the inversion signal CLKOB input to the MOSFET N71 is at a logic high level, a lot of current flows through the node ND6 as compared to the amount of current flowing through the node ND6 when the inversion signal CLKOB is at a logic low level. When the circuit of FIG. 9 is connected to the duty detector 330, the duty detector 330 can select and receive the corrected clock signal CLKO and the inversion signal CLKOB, or inversion signals of the corrected clock signal CLKO and the inversion signal CLKOB according to the logic state of the inversion locking signal IVS, and perform the operation of a differential amplifier.

Figure 2:
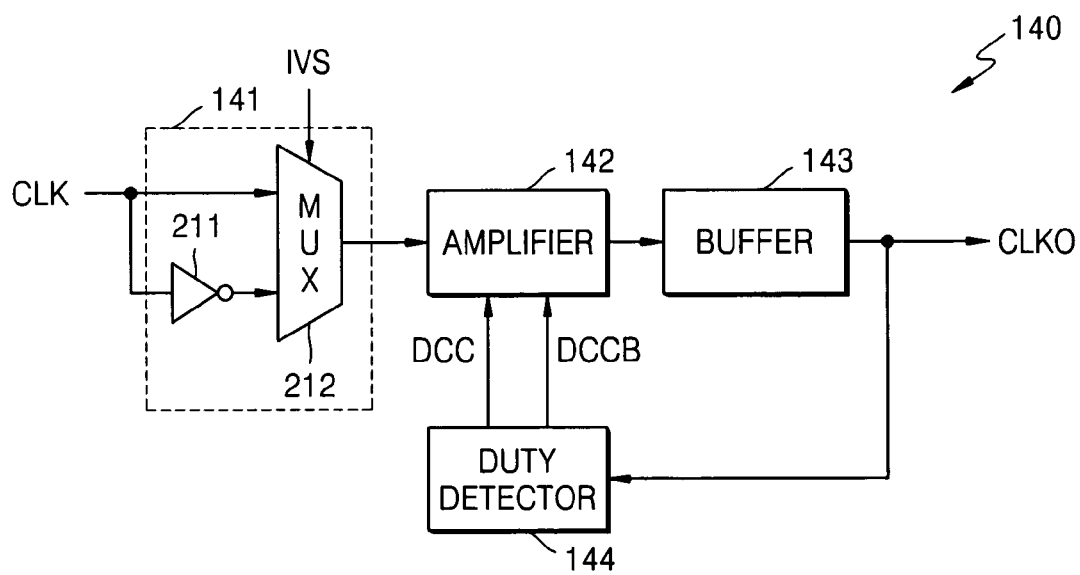
FIG. 2 is a detailed block diagram of a duty cycle correction circuit of FIG. 1.
Figure 10:
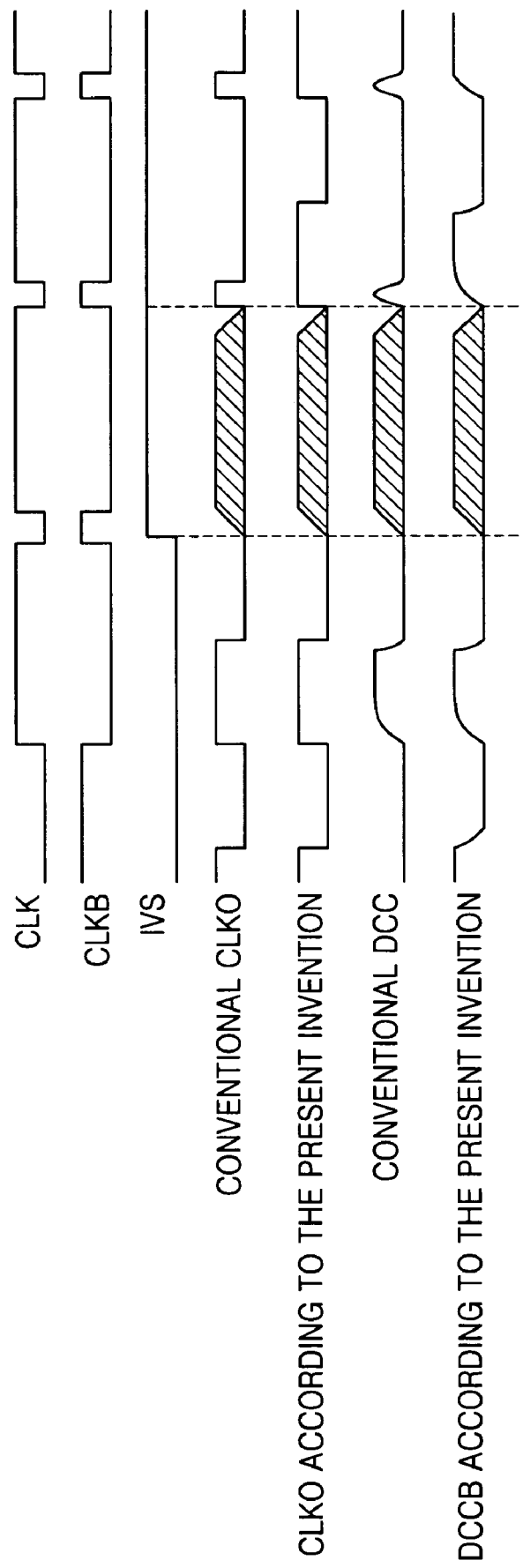
FIG. 10 is a timing diagram illustrating the operation of the duty cycle correction circuit of FIG. 3.

FIG. 10 is a timing diagram of signals illustrating the operation of the duty cycle correction circuit 300 of FIG. 3 and that of the conventional duty cycle correction circuit 140 of FIG. 2. Conventionally, when the amplifier 142 is stabilized after processing the input clock signal CLK and operates to correct the duty cycle of the inversion signal CLKB due to a change in the logic state of the inversion locking signal IVS, a corrected clock signal CLKO and duty correction signals DCC and DCCB, shown in FIG. 10, which are obtained right before the amplifier 142 operates to correct the duty cycle of the inversion signal CLKB, are used. Thus, when the amplifier 142 and the duty detector 144 of FIG. 2 operate in response to the inversion signal CLKB, they must correct the duty cycle of the newly input clock signal CLKB again. In other words, the inversion signal CLKB is input to the amplifier 142, but a duty correction signal DCC output from the duty detector 144 is substantially the same as the previously output duty correction signal DCC. Therefore, the amplifier 142 must further correct the duty cycle of the inversion signal CLKB, thereby increasing the locking time until the corrected clock signal CLKO is output having a corrected duty cycle.

In contrast, because both the correction unit 310 and the duty detector 330 of the duty cycle correction circuit 300 of FIG. 3 according to the present invention are controlled by the inversion locking signal IVS, an increase in the locking time can be prevented when the correction unit 310 operates to correct the duty cycle when the logic state of the inversion locking signal IVS changes. Referring to FIG. 10, when the correction unit 310 is stabilized after processing the input clock signal CLK and then operates to correct the duty cycle of the inversion signal CLKB due to a change in the logic state of the inversion locking signal IVS, the corrected clock signals CLKO and CLKOB are exchanged with each other and the duty correction signals DCC and DCCB are exchanged with each other. Accordingly, when the correction unit 310 operates to correct the duty cycle of the inversion signal CLKB, the amplifier 315 and the correction signal generator 335 of FIG. 3 can complete the duty cycle correction without experiencing a wide signal change, in contrast to the conventional duty cycle correction circuit 140. In other words, the inversion signal CLKB of the input clock signal CLK is input to the amplifier 315, and the duty correction signals DCC and DCCB output from the correction signal generator 335 are exchanged with each other and output. Therefore, the amplifier 315 does not have to further correct the duty cycle of the inversion signal CLKB.

Accordingly, when the duty cycle correction circuit 300 operates to correct the duty cycle of the inversion signal CLKB in response to the inversion locking signal IVS, the duty detector 330 generates the duty correction signals DCC and DCCB in response to the inversion signal CLKOB and the correction unit 310 exchanges the duty correction signals DCC and DCCB with each other, thus preventing an increase in locking time.

As described above, a duty cycle correction circuit according to the present invention is capable of preventing an increase in locking time when duty cycle correction is performed according to an inversion locking control scheme, thereby allowing a corrected clock signal to be stably generated while minimizing jitter. Thus, when the duty cycle correction circuit is applied to a semiconductor memory device, a video/audio processing system, or a communications system, it is possible to stably operate such a system.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A duty cycle correction circuit comprising:
    a correction unit exchanging and receiving a first duty correction signal and a second duty correction signal and selecting and receiving one of an input clock signal and an inversion signal of the input clock signal in response to an inversion locking signal, and correcting the duty cycle of the received input clock signal or inversion signal of the input clock signal in response to the first and second duty correction signals;
    a buffer buffering an output signal of the correction unit and outputting the buffered signal as a corrected clock signal; and
    a duty detector selecting and receiving one of the corrected clock signal and an inversion signal of the corrected clock signal in response to the inversion locking signal, and generating the first and second duty correction signals using the received corrected clock signal or inversion signal of the corrected clock signal.

2. The duty cycle correction circuit of claim 1, wherein the correction unit comprises:
    a selector selecting one of the input clock signal and the inversion signal of the input clock signal according to the logic state of the inversion locking signal;
    an exchanger exchanging the first and second duty correction signals with each other according to the logic state of the inversion locking signal; and
    an amplifier correcting the duty cycle of the clock signal selected by the selector, in response to the first and second duty correction signals output from the exchanger.

3. The duty cycle correction circuit of claim 2, wherein the amplifier is a differential amplifier which receives the input clock signal and the inversion signal of the input clock signal as a first pair of input signals, and receives the first and second duty correction signals as a second pair of input signals in parallel with the first pair of signals.

4. The duty cycle correction circuit of claim 3, wherein the amplifier comprises:
    a clock signal input unit receiving the first pair of input signals via first and second transistors; and
    a correction signal input unit receiving the second pair of input signals via third and fourth transistors.

5. The duty cycle correction circuit of claim 1, wherein the correction unit comprises a differential amplifier which selects and receives the input clock signal and the inversion signal of the input clock signal, or inversion signals of the input clock signal and the inversion signal of the input clock signal according to the logic state of the inversion locking signal.

6. The duty cycle correction circuit of claim 5, wherein the differential amplifier comprises:
a clock signal input unit receiving the input clock signal and the inversion signal of the input clock signal selected by a selector, wherein the clock signal input unit is connected to a selector selecting one of the input clock signal and the inversion signal of the input clock signal according to the logic state of the inversion locking signal.

7. The duty cycle correction circuit of claim 1, wherein the correction unit comprises a differential amplifier which selects and receives first and second duty correction signals, or the exchanged second and first duty correction signals according to the logic state of the inversion locking signal in parallel upon receipt of the clock signals.

8. The duty cycle correction circuit of claim 7, wherein the differential amplifier comprises:
a correction signal input unit receiving the first and second duty correction signals in parallel with the input clock signal and the inversion signal of the input clock signal, wherein the correction signal input unit is connected to an exchanger exchanging the first and second duty correction signals with each other according to the logic state of the inversion locking signal.

9. The duty cycle correction circuit of claim 1, wherein the duty detector comprises:
a selector selecting one of the corrected clock signal and the inversion signal of the corrected clock signal according to the logic state of the inversion locking signal; and
a correction signal generator generating the duty correction signals using the clock signal selected by the selector.

10. The duty cycle correction circuit of claim 9, wherein the correction signal generator comprises a differential amplifier which receives the corrected clock signal and the inversion signal of the corrected clock signal as a pair of input signals.

11. The duty cycle correction circuit of claim 10, wherein the differential amplifier comprises:
an output clock signal input unit receiving the corrected clock signal and the inversion of the corrected clock signal as the pair of input signals.

12. The duty cycle correction circuit of claim 1, wherein the duty detector comprises:
a selector selecting one of the clock signals according to the logic state of the inversion locking signal, wherein the selector is connected to an output clock signal input unit receiving the selected clock signal.

13. The duty cycle correction circuit of claim 11, wherein the duty detector selects and receives the corrected clock signal and the inversion of the clock signal according to the logic state of the inversion locking signal.

14. A duty cycle correction method comprising:
exchanging and receiving a first duty correction signal and a second duty correction signal according to an inversion locking signal;
selecting and receiving one of an input clock signal and an inversion signal of the input clock signal;
correcting the duty cycle of the received input clock signal or the inversion signal of the input clock signal in response to the first and second duty correction signals;
buffering the received input clock signal or the inversion signal of the input clock signal whose duty cycle is corrected, and outputting the buffered signal as a corrected clock signal;
selecting and receiving one of the corrected clock signal and the inversion signal of the corrected clock signal according to the inversion locking signal; and
generating the first and second duty correction signals, using the received corrected clock signal or the inversion signal of the corrected clock signal.

15. The duty cycle correction method of claim 14, wherein the step of correcting of the duty cycle of the received input clock signal or the inversion signal of the input clock signal comprises:
receiving the input clock signal and the inversion signal of the input clock signal as a first pair of input signals to be input to a differential amplifier;
receiving the first and second duty correction signals as a second pair of input signals to be input to the differential amplifier, in parallel with the first pair of input signals; and
generating the clock signal with the corrected duty cycle by operating the differential amplifier in response to the-input clock signal, the inversion signal of the input clock signal, and the first and second duty correction signals.

16. The duty cycle correction method of claim 14, wherein when the clock signal with the corrected duty cycle is generated by a differential amplifier,
the differential amplifier selects and receives the input clock signal and the inversion signal of the input clock signal, or inversion signals of the input clock signal and the inversion signal of the input clock signal according to the logic state of the inversion locking signal; and selects and receives the first and second duty correction signals, or the exchanged second and first duty correction signals according to the logic state of the inversion locking signal in parallel upon receipt of the clock signals.

17. The duty cycle correction method of claim 14, wherein the step of generating the first and second duty correction signals comprises:
receiving the corrected clock signal and the inversion signal of the corrected clock signal as a pair of input signals to be input to the differential amplifier; and
generating the first and second duty correction signals by operating the differential amplifier in response to the corrected clock signal and the inversion signal of the corrected clock signal.

18. The duty cycle correction method of claim 14, wherein when the first and second duty correction signals are generated by a differential amplifier,
the differential amplifier selects and receives the corrected clock signal and the inversion signal of the corrected clock signal, or inversion signals of the corrected clock signal and the inversion signal of the corrected clock signal according to the logic state of the inversion locking signal.

* * * * *